US009746529B2

(12) United States Patent
Maa et al.

(10) Patent No.: US 9,746,529 B2
(45) Date of Patent: Aug. 29, 2017

(54) METHODS AND SYSTEMS OF PROACTIVE MONITORING OF LED LIGHTS

(71) Applicant: Lightel Technologies, Inc., Renton, WA (US)

(72) Inventors: Chia-Yiu Maa, Bellevue, WA (US); Pai-Sheng Shen, Bellevue, WA (US); Chunte Yu, Bellevue, WA (US)

(73) Assignee: LIGHTEL TECHNOLOGIES, INC., Renton, WA (US)

( * ) Notice: Subject to any disclaimer, the term of this patent is extended or adjusted under 35 U.S.C. 154(b) by 552 days.

(21) Appl. No.: 14/527,691

(22) Filed: Oct. 29, 2014

(65) Prior Publication Data

US 2015/0127299 A1    May 7, 2015

Related U.S. Application Data

(60) Provisional application No. 61/899,222, filed on Nov. 3, 2013.

(51) Int. Cl.
*G01R 31/44* (2006.01)
*H05B 33/08* (2006.01)

(52) U.S. Cl.
CPC ......... *G01R 31/44* (2013.01); *H05B 33/0893* (2013.01)

(58) Field of Classification Search
CPC .................................................. G01R 31/44
See application file for complete search history.

(56) References Cited

U.S. PATENT DOCUMENTS

2014/0035465 A1\*    2/2014    Raj ................... H05B 33/0869
                                                                        315/151

\* cited by examiner

*Primary Examiner* — Manuel Rivera Vargas
(74) *Attorney, Agent, or Firm* — Han IP Corporation; Andy M. Han

(57) ABSTRACT

Various embodiments of methods and systems of proactive monitoring of LED lights are described herein. An LED light monitoring system may include a specification database of LED lamps and drivers, a usage database that records the usage of LED lamps and drivers, a data acquisition subsystem that obtains the identity and the usage data of LED lamps or drivers in use, and a data processing subsystem that calculates, for each LED lamp, its current lumen output statistically and, for each LED driver, its remaining lifetime, and provides replacement recommendations for LED lamps and drivers.

13 Claims, 4 Drawing Sheets

FIG. 3

METHODS AND SYSTEMS OF PROACTIVE MONITORING OF LED LIGHTS

CROSS REFERENCE TO RELATED PATENT APPLICATION

This is a non-provisional patent application claiming the priority benefit of U.S. Provisional Patent Application No. 61/899,222, filed on Nov. 3, 2013, which is incorporated by reference in its entirety.

TECHNICAL FIELD

The present disclosure relates to the monitoring of light-emitting diode (LED) lamp light output and driver lifetime of an LED light.

BACKGROUND

Traditional light sources such as the incandescent lamp, fluorescent lamp, and compact fluorescent lamp will stop emitting light at the end of its life. Thus, the method used to determine whether such a lamp has burnt out or not is very straightforward. In contrast, the LED luminaire uses an LED light source which behaves differently from the traditional light source in that 1) The LED light source does not cease to emit light for a very long time unless the driver of the LED light source failed, 2) the light efficacy of an LED light source decays gradually over time, e.g., dropping to 85% after 30,000 hours and to 70% after 50,000 hours of operation. This amounts to a daily efficacy decay rate of 0.017% (=30%/365/5) which is not discernable by human eye. As a result, a user under such a slowly decaying light source would not notice the 30% drop in light efficacy that would take place over a period of 5 years. This leads to the danger of a user being exposed to a poorly lit environment without knowing it.

Although most traditional light sources also possess the efficacy decay problem, they usually fail sooner than the light output drops to a significantly low level. Therefore their lumen degradation is less an issue compared to that of LED light source.

As user begins to use LED luminaires in over multiple locations on different equipment, it becomes very difficult to track down the operation time of each LED light source and its driver in an LED luminaire. It is equally challenging to determine the remaining lifetime of an LED light source until its lumen output drops to 70%. Best lighting practices generally recommends a lamp replacement when the lumen output falls below 70% of its original level. Working in a poorly lit environment for an extended period of time affects negatively a worker's vision and health. In the application of lighting up equipment such as vending machine or ATM machine, a poorly lit LED light reduces operability of the equipment and customer satisfaction.

The present disclosure provides a lumen maintenance monitoring system that can proactively track the operation time of each LED light source and driver registered with the system. It can alert a user when an LED lighting source is about to drop below a predefined lumen maintenance ratio or a driver is about to reach the end of its operation life. The system can also generate a maintenance schedule for preventative replacement of LED light sources and drivers, thus reducing the maintenance cost and keeping adequate light level where the LED lights are used at all time. Additionally, the lumen maintenance monitoring system has the flexibility of being deployed locally or over the Internet as a cloud service.

The present disclosure enables the lumen maintenance monitoring of LED lamps and drivers in a cost-effective and manageable manner, reduces the potential risk of user vision damage due to insufficiently lit LED lights, thereby protects facilities owners from related liabilities, and helps to uphold the quality and service image of the business entities that depend on well-lit LED lights for their products and services.

SUMMARY

The present disclosure is a system for monitoring LED luminaires. It comprises of at least one specification database, at least one usage database, at least one data acquisition subsystem, and at least one data processing subsystem. The specification database contains or otherwise stores the lumen maintenance decay data of various LED lamps and the lifetime data of various LED drivers.

The usage database of the present disclosure contains or otherwise stores the usage information of the LED lamp and driver registered with the system, such as operation start date, daily operation hours, the light dimming level information, etc.

The data acquisition subsystem of the present disclosure captures or otherwise obtains the identity of an LED lamp or driver in use and the identity data such as the model number of the LED lamp or driver and its unique ID in the system.

The data processing subsystem of the present disclosure statistically calculate the lumen output of an LED lamp or the remaining lifetime of an LED driver, by using its usage data in the usage database, its identity captured by the data acquisition subsystem, and the LED lamp and driver specification data in the specification database. For example, by using the start date and the daily operation hours, the data processing subsystem can determines the total operation hours of an LED lamp. The data processing subsystem can then compare with the lumen maintenance decay data of the LED lamp in the specification database according to the total operation hours for interpolating the current lumen maintenance level of the LED lamp. Similarly, by comparing the total operation hours of an LED driver and the statistical lifetime data of this driver type in the specification database, the data processing subsystem can determine the remaining lifetime of the driver. The data processing subsystem provides also a user interface for a user to enter the data into the subsystem.

Before a new type of LED lamp or driver can be monitored by the system of the present disclosure, its specification data needs to be entered and stored the specification database first. Then upon the installation and first operation of this LED lamp or driver, the data acquisition subsystem is used to capture its identity and then passes it to the data processing system. The data processing subsystem will then record the additional information such as the start date, daily operation hour, etc., and save them along with the to the lamp/driver identity to the usage database. Upon subsequent maintenance check-ups of the LED lamp or driver in use, the data acquisition subsystem again identifies its identity and passed it to the data processing subsystem. The data processing subsystem retrieves the start date and daily operation information from the usage database, captures the current date, calculates the total operation hours of the LED lamp or driver, and then compare it to the data in the specification database to drive statistically the current lumen output level of the LED lamp or the remaining lifetime of the LED driver.

An LED luminaire may have more than one LED lamps and drivers. As the lamps and drivers are replaced over time, the start date of these components will be different. Moreover, newer LED lamp models are likely to have a higher lumen output and a longer lifetime. It is therefore important to calculate individually the lumen output of each LED lamp and the remaining lifetime of each driver. The system of the present disclosure supports the usage tracking of LED lamp and driver individually, thus greatly enhancing the monitoring capability of LED lights for large facilities or business operations.

In one aspect of the present disclosure, the usage database of the present disclosure records, in addition to the start date of the LED lamp or driver, the daily usage hours, e.g., 8 am to 6 pm, or usage pattern, e.g., Monday to Friday. This enables the data processing subsystem to calculate the actual total usage hour of an LED lamp or driver.

When an LED lamp or driver operates at a reduced power level, for example, dimmed at 50% of its full capacity, the lamp or driver's effective usage is actually half of that operating in full capacity. If a lamp is on in 24-hour per day fashion, yet 50% of the time at 100% lumen output and 50% of the time at 30% lumen output, then its effective daily usage hour is 12 hours*100%+12 hours*30%=12+3.6=15.6 hours, not 24 hours. If the L70 maintenance hours (the total hours before the lumen output drop below 70% of its original level) of the LED lamp is 50,000 hours when operating in 100% power level, operating at 15.6 effective-daily-hour extends the total L70 maintenance hours from 50,000 to 50,000*24/15.6=76,900 hours.

Thus, by factoring in the dimming level and duration, the extended overall operation hours of the LED lamp increases by more than 50%. This could lead to 50% material and labor savings on LED lamp and driver maintenance costs. Another aspect of the present disclosure is that the data processing subsystem uses the light dimming level and duration to calculate the effective daily usage hours of an LED lamp or driver, or its extended overall operation hours so as to reduce the LED lamp and driver maintenance costs.

In another aspect of the present disclosure, the data processing subsystem issues a replacement recommendation automatically when the statistically calculated lumen output of the LED lamp in use falls below a predefined lumen output threshold or when the driver operation time exceeds a predefined operation hours threshold. This features relieve the operator from the burden of figuring out when an LED lamp or driver should be replaced.

In another aspect of the present disclosure, the system includes a maintenance schedule module that calculates the maintenance schedule of LED lamps and drivers in use according to their usage data in the usage database and the predefined operation hours threshold of the LED lamps and drivers stored in the specification database. The maintenance schedule module can be implemented as a standalone subsystem, as a backend processing module on a centralized usage database, or as add-on module on a centralized data processing subsystem.

In another aspect of the present disclosure, the data acquisition subsystem that captures the identity of an LED lamp or driver can take the form of barcode reader, QR Code reader, RFID (radio frequency identification) reader, magnetic stripe reader, smart card reader, or any other format that falls into the category of automatic identification and data capture device. The benefit of using these devices is that it doesn't require manual input of the identity data which is both time-consuming and error-prone. More importantly, the device may require making physical contact with the LED lamp or driver when capturing the identity data. This is makes the identity data capture highly user friendly, and is especially beneficiary for acquiring of identity of an LED lamp or driver installed in a hard to reach place, e.g. inside a refrigerator or hidden behind a cover plate.

In another aspect of the present disclosure, the subsystems may run on one or more personal computer, tablet computer, smart phone, or any other computing device or equipment with data entry, processing, and storage capabilities. When running on more than one physical computing devices, the components of the system are connected via wired or wireless or the combination thereof communication mechanism through point-to-point, local area network, wide area network, or internet. There is no restriction to have all components of the system running one physical device or physical location. For a large scale deployment, the computing device used by a field maintenance crew may contain only a partial specification database as related to the LED lamps and drivers used in his/her territory, the usage data of these lamps/drivers, the data acquisition subsystem, and the data processing system. In such scenario, the local data processing subsystem may upload the local usage database to a centralized usage database at a data center, and the local data processing may also download the partial specification database update from a centralized specification database in the data center to the local specification database to the computing device used by the maintenance crew on an as-needed basis.

The claims and advantages will be more readily appreciated as the same becomes better understood by reference to the following detailed description and the accompanying drawings showing exemplary embodiments, in which like reference symbols designate like parts. For clarity, various parts of the embodiments in the drawings are not drawn to scale.

BRIEF DESCRIPTION OF THE DRAWINGS

The accompanying drawings are included to aid further understanding of the present disclosure, and are incorporated in and constitute a part of the present disclosure. The drawings illustrate a select number of embodiments of the present disclosure and, together with the detailed description below, serve to explain the principles of the present disclosure. It is appreciable that the drawings are not necessarily in scale as some components may be shown to be out of proportion than the size in actual implementation in order to clearly illustrate the concept of the present disclosure.

FIG. 3 schematically depicts an embodiment of the user interface of a local data processing subsystem.

DETAILED DESCRIPTION OF PREFERRED EMBODIMENTS

Various implementations of the present disclosure and related inventive concepts are described below. It should be acknowledged, however, that the present disclosure is not limited to any particular manner of implementation, and that the various embodiments discussed explicitly herein are primarily for purposes of illustration.

Figure 1:
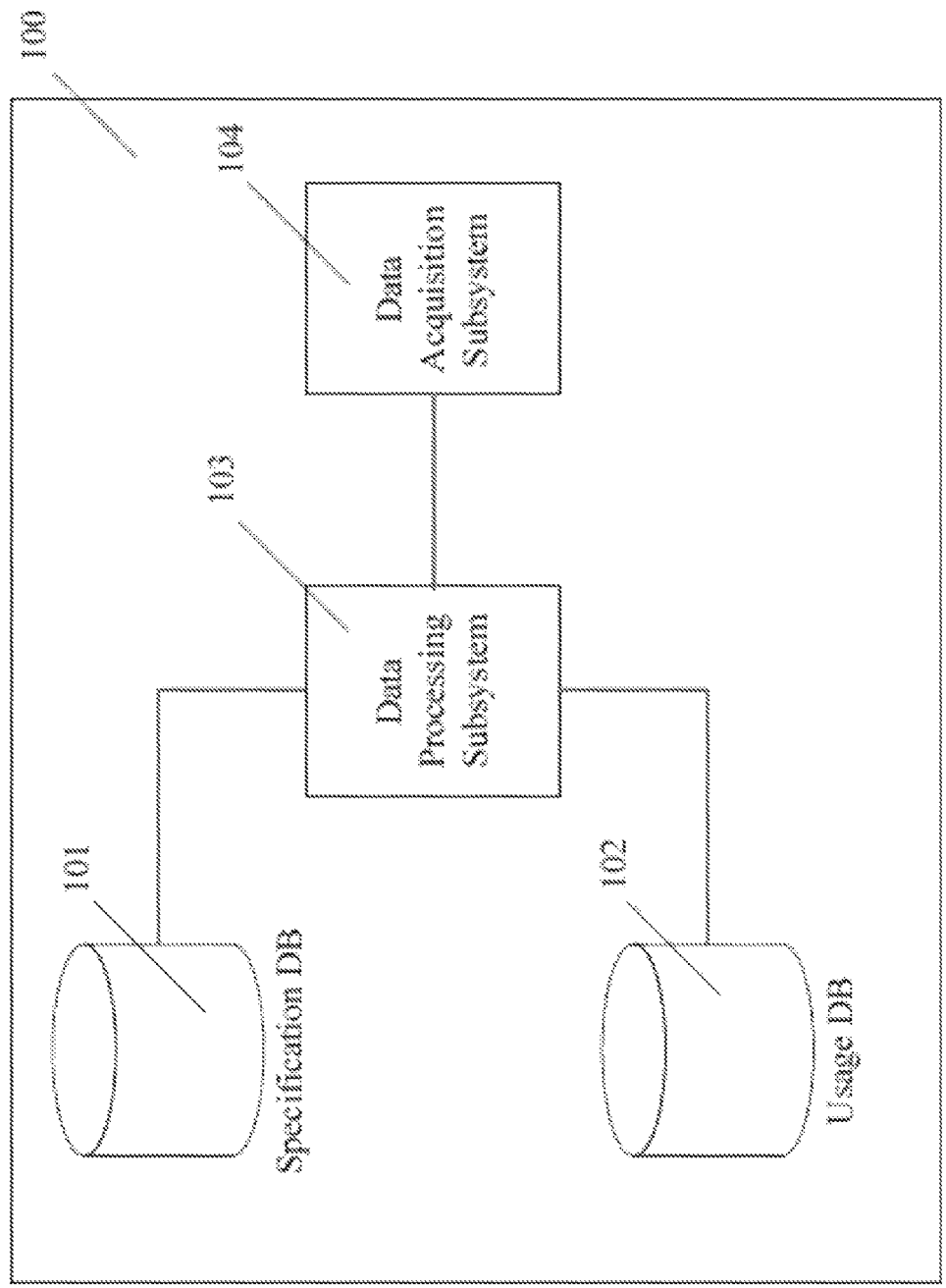
FIG. 1 schematically depicts an embodiment of the present disclosure wherein the LED light monitoring system comprises of one specification database, one usage database, one data processing subsystem, and one data acquisition subsystem.

FIG. 1 illustrates one non-limiting example of a system according to one embodiment of the present disclosure. The LED light monitoring system 100 includes one specification database 101, one usage database 102, one data processing subsystem 103, and one data acquisition subsystem 104.

The specification database 101 contains the specification information of every type of LED lamp and driver to be monitored by the present disclosure. The information includes, but is not limited to, the model information of each LED lamp and its lumen maintenance decay data, and the model information of each LED driver and its lifetime data.

The usage database 102 includes, but is not limited to, the start time, the daily operation hour, the dimming information, and the effective daily usage hour of LED lamps and drivers.

The data processing subsystem 103 collects the usage data, stores the data in the usage database 102, computes the total operation hours and the effective daily usage hours of an LED lamp and compares it with the corresponding lumen maintenance decay data in the specification database 101 to determine the current lumen output level of the LED lamp. The data processing subsystem 103 also computes total operation hours of an LED driver and compares them with the corresponding driver lifetime data in the specification database 101 to determine the remaining lifetime of the LED driver.

Though not shown in the figure, the data processing subsystem 103 has a user interface for a user to enter the data, such as the start date, current date, the daily operation hours, and the dimming information into the subsystem.

Alternatively, the user interface of the data processing subsystem 103 includes a function for issuing replacement alert either when the lumen output of an LED light source of an LED lamp falls below a predefined lumen output threshold, or when the driver operation time exceeds a predefined lifetime threshold.

Alternatively, the user interface of the data processing subsystem 103 includes a function to display the lumen maintenance decay curve of an LED lamp.

The data acquisition subsystem comprises the hardware and the software for capturing the identity information of an LED lamp or driver without human data entry. It requires a suitable ID attached on the LED lamp or driver. The ID format can take the form of barcode reader, QR Code reader, RFID (radio frequency identification) reader, magnetic stripe reader, smart card reader, or any other format that falls into the category of automatic identification and data capture device.

The subsystems of the embodiment 100 may run on one or more personal computer, tablet computer, smart phone, or any other computing device or equipment with data entry, processing, and storage capabilities, and when running on more than one physical computing devices, the components of the system are connected via wired or wireless or the combination thereof communication mechanism through point-to-point, local area network, wide area network, or internet.

Figure 2:
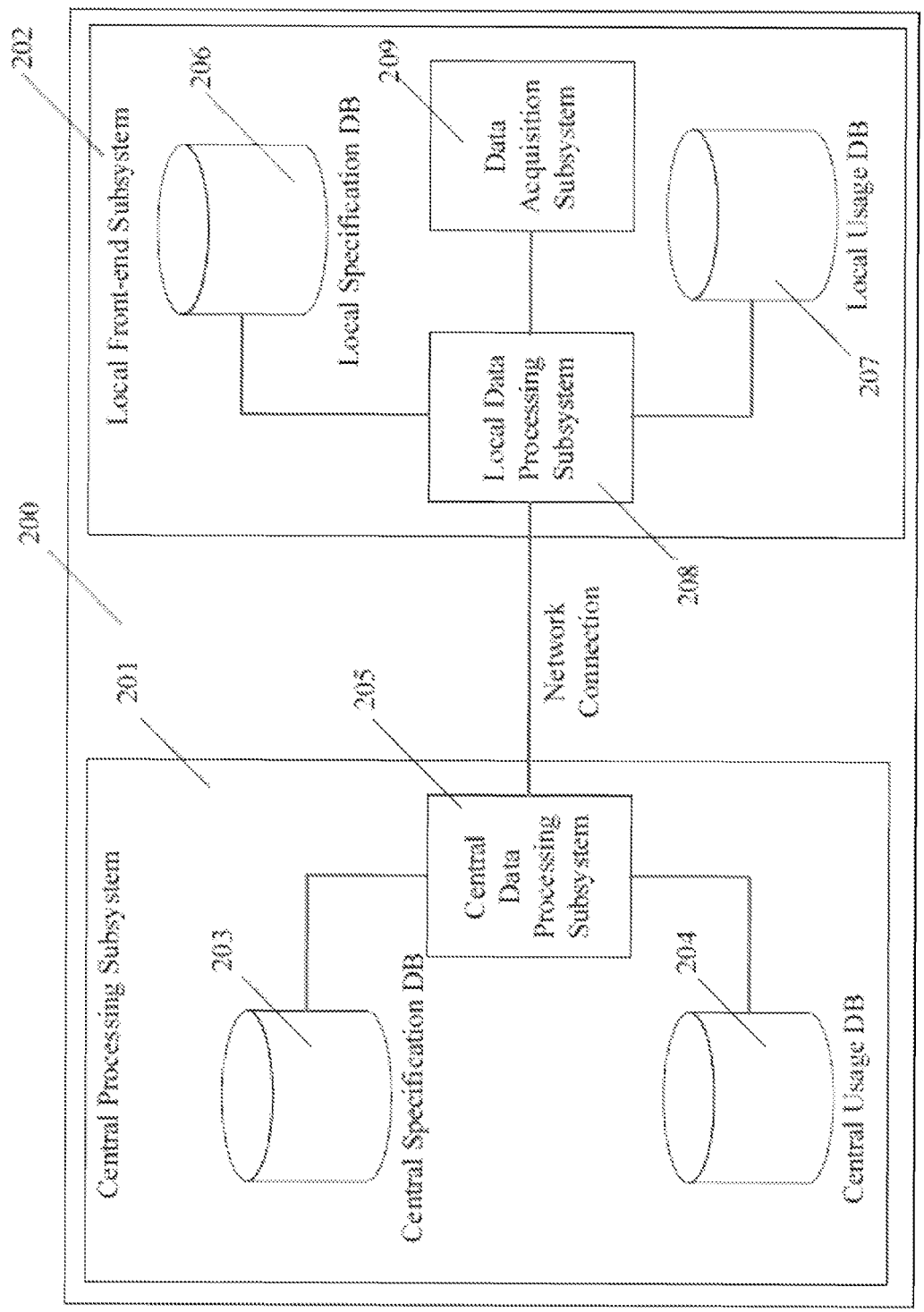
FIG. 2 schematically depicts an embodiment of the present disclosure wherein the LED light monitoring system is split into a central processing subsystem and a user front-end subsystem. The central processing subsystem contains one central specification database, one central usage database, and the central data processing subsystem. Each user front-end subsystem contains a local specification database, a local usage database, the local data processing subsystem, and the data acquisition subsystem.

FIG. 2 illustrates another example of the present disclosure, wherein the LED light monitoring system 200 is split into two subsystems: the central processing subsystem 201 and multiple local front-end subsystems 202 for multiple users. The central processing subsystem 202 includes the central specification database 203, the central usage database 204, and the central data processing subsystem 205. The local front-end subsystem 202 includes a local specification database 206, a local usage database 207, a local data processing subsystem 208, and the data acquisition subsystem 209.

The local specification database 206 may only contain only the specification data related to the LED lamps and drivers responsible by the local user. Similarly, the local usage database 207 therefore contains the usage data related to these lamps and drivers.

The local data processing subsystem 208 may download additional specification data or specification updates from the central specification database 203 at the data center to the local specification database 206 on an as-needed basis. Similarly, the local data processing subsystem 208 may upload the local usage data to the central usage database 204.

In this central-local subsystem configuration, the user interface for data entry and displaying replacement alert is performed by the local data processing subsystem 208. In contrast, the central data processing subsystem 205 will have a maintenance schedule module that calculates the maintenance schedule of LED lamps and drivers in use according to their usage data in the central usage database 2004 and the predefined operation hours threshold of the LED lamps and drivers stored in the central specification database 203.

The local front-end subsystem 202 can run on a personal computer, tablet computer, smart phone, or any other electronic device or equipment with data entry, processing, and storage capabilities. The central processing subsystem 201 can run on a local area network server, a wide area network server, or an Internet cloud server. The local front-end subsystem and central processing subsystem are connected via any data network, wired or wireless, and the combination thereof.

Figure 3:
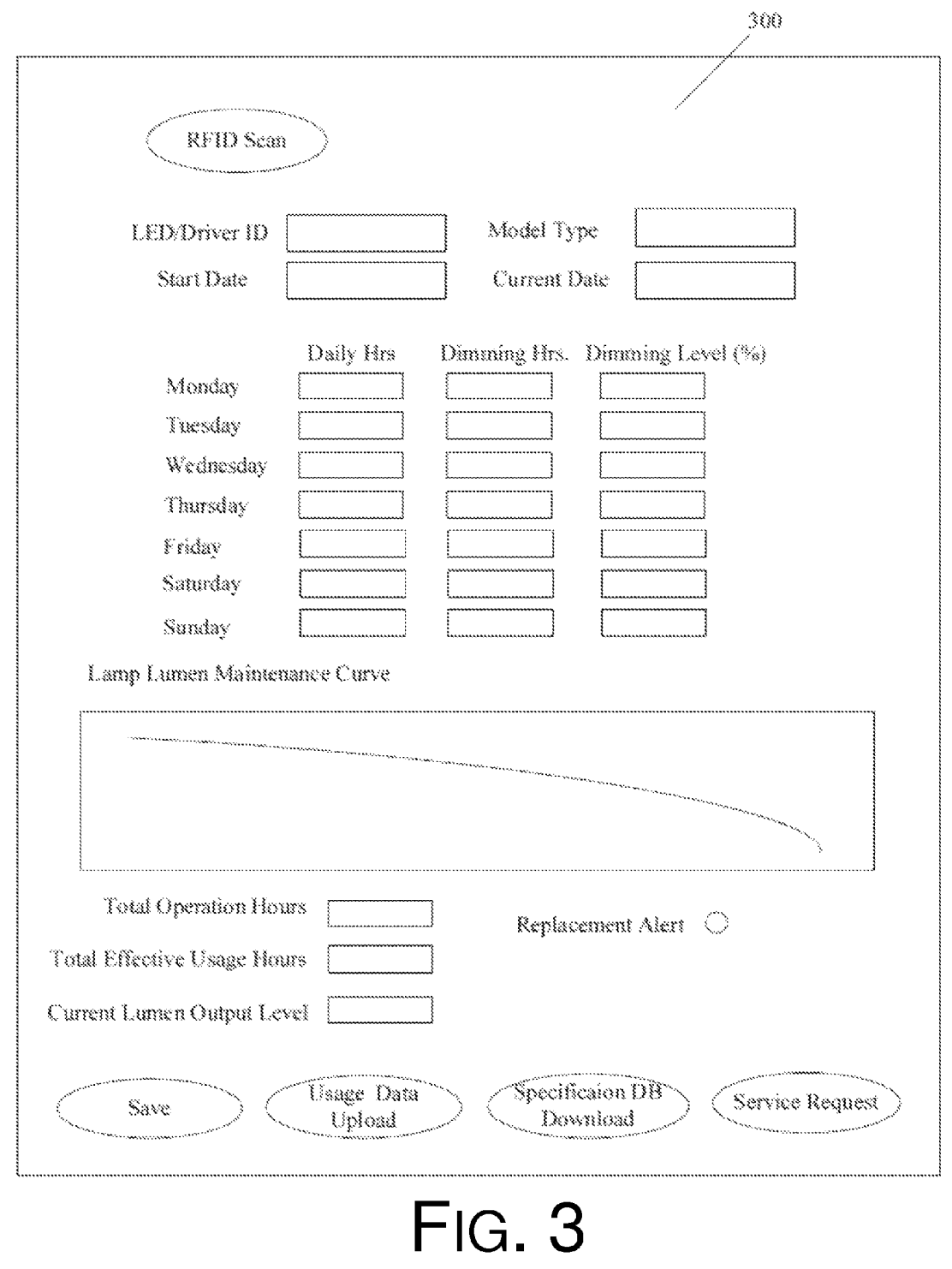

FIG. 3 illustrates an embodiment of the user interface module of the local data processing subsystem 208 of the present disclosure. A user first clicks the "RFID Scan" button to trigger an RFID based data acquisition subsystem 209 to activate the scanning of the RFID of an LED lamp or driver. If the lamp or driver has already been registered with the local usage database, its start date and settings will be displayed automatically in the corresponding data fields. The total operation hours, the total effective usage hours (by factoring the dimming setting), the estimated current light output level, and the replacement alert will be calculated by the local data processing subsystem 208 according to the settings and the current date. The lumen maintenance curve of the LED lamp may also be displayed.

If the LED lamp or driver has not yet been registered with the local usage database 207, the user interface prompts the user to enter the setting information on daily operation hours, daily dimming hours, and dimming level. By clicking the "Save" button, the setting and the start date will then be saved to the local usage database 207 for subsequent data retrieval and usage calculation.

When clicking the "Usage Data Upload" button, the data in the local usage database 207 will be uploaded to the central usage database 204. When clicking the "Specification DB Download" button, the relevant specification database will be downloaded from the central specification database 203 to the local specification database 206. A user can also submit a service request to the central data processing system 205 by clicking the "Service Request" button.

Figure 4:
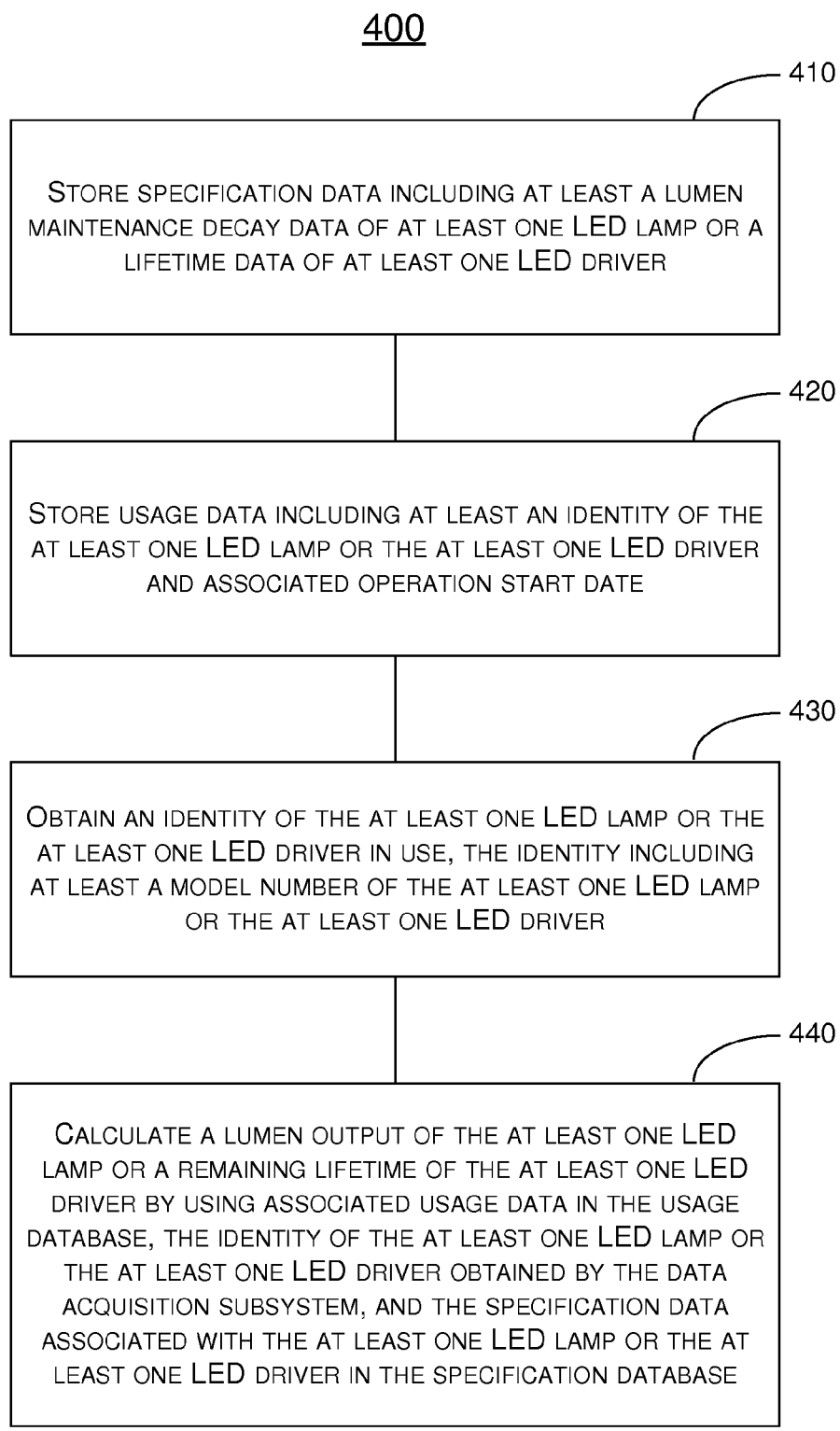
FIG. 4 is a flowchart of an example process in accordance with an embodiment of the present disclosure.

FIG. 4 illustrates an example process 400 in accordance with an embodiment of the present disclosure.

At 410, example process 400 may involve the specification database 101, 203 or 206 storing specification data including at least a lumen maintenance decay data of at least one LED lamp or a lifetime data of at least one LED driver.

At 420, example process 400 may involve the usage database 102, 204 or 207 storing usage data including at least an identity of the at least one LED lamp or the at least one LED driver and associated operation start date.

At 430, example process 400 may involve the data acquisition subsystem 104 or 209 obtaining or acquiring an identity of the at least one LED lamp or the at least one LED driver in use, the identity including at least a model number of the at least one LED lamp or the at least one LED driver.

At 440, example process 400 may involve the data processing subsystem 103, 205 or 208 indicating a lumen output of the at least one LED lamp or a remaining lifetime of the at least one LED driver by using associated usage data in the usage database, the identity of the at least one LED lamp or the at least one LED driver obtained by the data acquisition subsystem, and the specification data associated with the at least one LED lamp or the at least one LED driver in the specification database.

In at least some embodiments, example process 400 may additionally involve the usage database 102, 204 or 207 recording additional hours-per-day usage data. Moreover, example process 400 may also involve the data processing subsystem 103, 205 or 208 calculating an actual total usage hour of the at least one LED lamp or the at least one LED driver based at least in part on the additional hours-per-day usage data.

In at least some embodiments, example process 400 may additionally involve the usage database 102, 204 or 207 recording light dimming information. Furthermore, example process 400 may also involve the data processing subsystem 103, 205 or 208 calculating an effective daily usage hours of either or both of the at least one LED lamp and the at least one LED driver based at least in part on the light dimming information.

In at least some embodiments, example process 400 may additionally involve the data processing subsystem 103, 205 or 208 indicating a replacement recommendation automatically when the statistically calculated lumen output of the at least one LED lamp is below a predefined lumen output threshold or when a driver operation time of the at least one LED driver exceeds a predefined operation hours threshold.

In at least some embodiments, example process 400 may additionally involve a maintenance schedule module calculating a maintenance schedule of one or more LED lamps of the at least one LED lamp in use or one or more LED drivers or the at least one LED driver in use according to associated usage data in the usage database and a predefined operation hours threshold of the one or more LED lamps and the one or more LED drivers stored in the specification database.

Although the techniques have been described in language specific to certain applications, it is to be understood that the appended claims are not necessarily limited to the specific features or applications described herein. Rather, the specific features and examples are disclosed as non-limiting exemplary forms of implementing such techniques.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

For the purposes of this disclosure and the claims that follow, the terms "coupled" and "connected" may have been used to describe how various elements interface. Such described interfacing of various elements may be either direct or indirect.

What is claimed is:

1. A light-emitting diode (LED) light monitoring system, comprising:
   a specification database;
   a usage database;
   a data acquisition subsystem; and
   a data processing subsystem, wherein:
      the specification database is configured to store specification data including at least a lumen maintenance decay data of at least one LED lamp or a lifetime data of at least one LED driver;
      the usage database is configured to store usage data including at least an identity of the at least one LED lamp or the at least one LED driver and associated operation start date;
      the data acquisition subsystem is configured to obtain an identity of the at least one LED lamp or the at least one LED driver in use, the identity including at least a model number of the at least one LED lamp or the at least one LED driver;
      the data processing subsystem is configured to statistically calculate a lumen output of the at least one LED lamp or a remaining lifetime of the at least one LED driver by using associated usage data in the usage database, the identity of the at least one LED lamp or the at least one LED driver obtained by the data acquisition subsystem, and the specification data associated with the at least one LED lamp or the at least one LED driver in the specification database.

2. The LED light monitoring system of claim 1, wherein the usage database is further configured to record additional hours-per-day usage data, and wherein the data processing subsystem is further configured to calculate an actual total usage hour of the at least one LED lamp or the at least one LED driver based at least in part on the additional hours-per-day usage data.

3. The LED light monitoring system of claim 2, wherein the usage database is further configured to record light dimming information, and wherein the data processing subsystem is further configured to calculate an effective daily usage hours of either or both of the at least one LED lamp and the at least one LED driver based at least in part on the light dimming information.

4. The LED light monitoring system of claim 1, wherein the data processing subsystem is further configured to indicate a replacement recommendation automatically when the statistically calculated lumen output of the at least one LED lamp is below a predefined lumen output threshold or when a driver operation time of the at least one LED driver exceeds a predefined operation hours threshold.

5. The LED light monitoring system of claim 1, further comprising:
a maintenance schedule module configured to calculate a maintenance schedule of one or more LED lamps of the at least one LED lamp in use or one or more LED drivers or the at least one LED driver in use according to associated usage data in the usage database and a predefined operation hours threshold of the one or more LED lamps and the one or more LED drivers stored in the specification database.

6. The LED light monitoring system of claim 1, wherein the data acquisition subsystem comprises a barcode reader, a quick response (QR) code reader, a radio frequency identification (RFID) reader, a magnetic stripe reader, a smart card reader, or an automatic identification and data capture device.

7. The LED light monitoring system of claim 1, wherein at least one of the data acquisition subsystem or the data processing subsystem is implemented in one or more of a personal computer, a tablet computer, a smart phone, or a computing device capable of data entry, data processing and data storage.

8. The LED light monitoring system of claim 1, wherein at least some of the specification database, the usage database, the data acquisition subsystem, and the data processing subsystem communicate with each other through a point-to-point communication mechanism, a local area network, a wide area network, the Internet, or a combination thereof in either or both of wired and wireless ways.

9. A method of proactive monitoring of light-emitting diode (LED) lights, comprising:
storing, in a specification database, specification data including at least a lumen maintenance decay data of at least one LED lamp or a lifetime data of at least one LED driver;
storing, in a usage database, usage data including at least an identity of the at least one LED lamp or the at least one LED driver and associated operation start date;
obtaining, by a data acquisition subsystem, an identity of the at least one LED lamp or the at least one LED driver in use, the identity including at least a model number of the at least one LED lamp or the at least one LED driver; and
calculating, by a data processing subsystem, a lumen output of the at least one LED lamp or a remaining lifetime of the at least one LED driver by using associated usage data in the usage database, the identity of the at least one LED lamp or the at least one LED driver obtained by the data acquisition subsystem, and the specification data associated with the at least one LED lamp or the at least one LED driver in the specification database.

10. The method of claim 9, further comprising:
recording, by the usage database, additional hours-per-day usage data; and
calculating, by the data processing subsystem, an actual total usage hour of the at least one LED lamp or the at least one LED driver based at least in part on the additional hours-per-day usage data.

11. The method of claim 10, further comprising:
recording, by the usage database, light dimming information; and
calculating, by the data processing subsystem, an effective daily usage hours of either or both of the at least one LED lamp and the at least one LED driver based at least in part on the light dimming information.

12. The method of claim 9, further comprising:
indicating, by the data processing subsystem, a replacement recommendation automatically when the statistically calculated lumen output of the at least one LED lamp is below a predefined lumen output threshold or when a driver operation time of the at least one LED driver exceeds a predefined operation hours threshold.

13. The method of claim 9, further comprising:
calculating, by a maintenance schedule module, a maintenance schedule of one or more LED lamps of the at least one LED lamp in use or one or more LED drivers or the at least one LED driver in use according to associated usage data in the usage database and a predefined operation hours threshold of the one or more LED lamps and the one or more LED drivers stored in the specification database.

\* \* \* \* \*